US011545193B2

(12) United States Patent
Park et al.

(10) Patent No.: US 11,545,193 B2
(45) Date of Patent: Jan. 3, 2023

(54) NONVOLATILE MEMORY DEVICE FOR PERFORMING DOUBLE SENSING OPERATION

(71) Applicant: SK hynix Inc., Gyeonggi-do (KR)

(72) Inventors: Tae Hun Park, Gyeonggi-do (KR); Yeong Jo Mun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/398,561

(22) Filed: Aug. 10, 2021

(65) Prior Publication Data

US 2022/0284933 A1    Sep. 8, 2022

(30) Foreign Application Priority Data

Mar. 4, 2021    (KR) ........................ 10-2021-0028760

(51) Int. Cl.
| | | |
|---|---|---|
| *G11C 16/10* | (2006.01) | |
| *G11C 7/10* | (2006.01) | |
| *G11C 16/26* | (2006.01) | |
| *G11C 16/04* | (2006.01) | |
| *G11C 16/34* | (2006.01) | |

(52) U.S. Cl.
CPC ............ *G11C 7/1039* (2013.01); *G11C 7/106* (2013.01); *G11C 7/1087* (2013.01); *G11C 16/0433* (2013.01); *G11C 16/26* (2013.01); *G11C 16/3409* (2013.01)

(58) Field of Classification Search
CPC ..... G11C 7/1039; G11C 7/106; G11C 7/1087; G11C 16/0433; G11C 16/26; G11C 16/3409
See application file for complete search history.

(56) References Cited

U.S. PATENT DOCUMENTS

| | | | |
|---|---|---|---|
| 2012/0113725 A1* | 5/2012 | Ahn | ..................... G11C 11/5628 365/185.22 |
| 2018/0144800 A1* | 5/2018 | Park | ....................... G11C 16/10 |

FOREIGN PATENT DOCUMENTS

| | | |
|---|---|---|
| KR | 10-1003935 B1 | 12/2010 |
| KR | 10-1066746 B1 | 9/2011 |

* cited by examiner

*Primary Examiner* — Xiaochun L Chen
(74) *Attorney, Agent, or Firm* — IP & T Group LLP

(57) ABSTRACT

A nonvolatile memory device comprising: a cell string comprising a plurality of memory cells, a bit line coupled to the cell string, and a page buffer suitable for precharging the bit line, a first sensing node and a second sensing node to a preset level in a first period, and double-sensing the bit line through the first and second sensing nodes in a second period, wherein the page buffer comprises: a first coupling unit suitable for coupling the bit line and the first sensing node, a second coupling unit suitable for coupling the first and second sensing nodes, and controlling the first and second sensing nodes to have a voltage level interval according to a preset ratio in the second period, a first and second latch units suitable for latching a logic levels corresponding to a voltage levels of the first and second sensing nodes, respectively.

12 Claims, 8 Drawing Sheets

NONVOLATILE MEMORY DEVICE FOR PERFORMING DOUBLE SENSING OPERATION

CROSS-REFERENCE TO RELATED APPLICATION

This application claims priority under 35 U.S.C. § 119 to Korean Patent Application No. 10-2021-0028760 filed on Mar. 4, 2021, which is incorporated herein by reference in its entirety.

BACKGROUND

1. Field

Various embodiments relate to a semiconductor device, and more particularly, to a nonvolatile memory device for performing a double sensing operation.

2. Discussion of the Related Art

A semiconductor memory device is a memory device which is implemented using a semiconductor such as silicon (Si), germanium (Ge), gallium arsenide (GaAs) or indium phosphide (InP). The semiconductor memory device may be roughly divided into a volatile memory device and a nonvolatile memory device.

The nonvolatile memory device indicates a memory device that retains data stored therein, even though power supplied thereto is removed. Examples of the nonvolatile memory device may include a ROM (Read Only Memory), PROM (Programmable ROM), EPROM (Electrically Programmable ROM), EEPROM (Electrically Erasable and Programmable ROM), flash memory device, PRAM (Phase-change RAM), MRAM (Magnetic RAM), RRAM (Resistive RAM) and FRAM (Ferroelectric RAM). The flash memory may be roughly divided into a NOR flash memory and a NAND flash memory.

Among nonvolatile memory devices, a flash memory device may store data in a memory cell by controlling the amount of charge retained in a conductive band of a floating gate such that the threshold voltage of the memory cell is changed. That is, when a program pulse is applied to the floating gate, the threshold voltage of the memory cell may rise. By using the program pulse, the flash memory device may change the threshold voltage of the memory cell according to the value of data to be stored in the memory cell. However, the nonvolatile memory device may include a plurality of memory cells, and the memory cells may have different characteristics. Therefore, the threshold voltages of memory cells having the same data stored therein may have a predetermined distribution instead of one value.

SUMMARY

Various embodiments are directed to a nonvolatile memory device capable of performing a double sensing operation by using two sensing voltages at a time.

The technical concerns to be solved by the present disclosure are not limited to those mentioned above, and the other technical concerns which are not mentioned can be clearly understood by the person skilled in the art, to which the present disclosure pertains, from the following descriptions.

In accordance with an embodiment of the present invention, a nonvolatile memory device may include: a cell string comprising a plurality of memory cells coupled in series; a bit line coupled to the cell string; and a page buffer suitable for precharging the bit line, a first sensing node and a second sensing node to a preset level in a first period, and double-sensing the bit line through the first and second sensing nodes in a second period. The page buffer may include: a first coupling unit suitable for coupling the bit line and the first sensing node in response to a first control signal; a second coupling unit suitable for coupling the first and second sensing nodes in response to a second control signal, and controlling the first and second sensing nodes to have a voltage level interval according to a preset ratio in the second period; a first latch unit suitable for latching a logic level corresponding to a voltage level of the first sensing node in response to a third control signal; and a second latch unit suitable for latching a logic level corresponding to a voltage level of the second sensing node in response to a fourth control signal.

The second coupling unit may include: a switch suitable for selectively coupling the first and second sensing nodes in response to the second control signal; and a capacitor coupled in parallel to the switch between the first and second sensing nodes.

The switch may include an NMOS transistor suitable for selectively coupling the first and second sensing nodes, which are connected to drain and source thereof, in response to the second control signal applied to a gate thereof.

The page buffer may further include a third coupling unit suitable for selectively coupling a core voltage terminal and the first sensing node in response to a fifth control signal, and may further include a control signal generator suitable for generating the first to fifth control signals.

The control signal generator may be further suitable for: activating the first, second and fifth control signals in the first period, deactivating the second and fifth control signals and activating the first control signal, in a third period included in the second period, and deactivating the first, second and fifth control signals and toggling the third and fourth control signals, in a fourth period included in the second period and subsequent to the third period.

The page buffer may precharge the bit line and the first and second sensing nodes to a core voltage level by coupling the bit line, the first and second sensing nodes and the core voltage terminal through the first to third coupling units in the first period. The page buffer may be further suitable for evaluating voltage levels of the bit line and the first sensing node by decoupling the first sensing node from the core voltage terminal through the third coupling unit and coupling the bit line and the first sensing node through the first coupling unit, in the third period. The page buffer may control the first and second sensing nodes to have the voltage level interval according to the preset ratio by coupling the first and second sensing nodes through the capacitor of the second coupling unit, in the third period. The page buffer may be further suitable for coupling the first sensing node and the bit line and decoupling the first sensing node from the core voltage terminal through the first and third coupling units and latching, respectively in the first and second latch units, logic levels corresponding to the voltage levels of the first and second sensing nodes in response to the toggling of the third and fourth control signals, in the fourth period.

The control signal generator may be further suitable for activating the first and second control signals and deactivating the fifth control signal in a fifth period included in the second period and prior to the third period.

The page buffer may be further suitable for evaluating the voltage levels of the bit line and the first and second sensing nodes by decoupling the first sensing node from the core voltage terminal through the third coupling unit and coupling the bit line and the first and second sensing nodes through the first and second coupling units, in the fifth period.

The control signal generator may be further suitable for adjusting a length of the fifth period by adjusting a length of a period in which the second control signal is activated while the first control signal is activated and the fifth control signal is deactivated.

The page buffer may use a ratio of respective lengths of the third and fifth periods as the preset ratio.

The page buffer may control the first and second sensing nodes to have a greater voltage level interval by decreasing the length of the fifth period and increasing the length of the third period. The page buffer may control the first and second sensing nodes to have a less voltage level interval by increasing the length of the fifth period and decreasing the length of the third period.

In accordance with an embodiment of the present invention, a nonvolatile memory device may include: a bit line coupled to a cell string; a page buffer including: a coupling circuit including a switching element and a capacitive element, which are coupled in parallel between first and second nodes, first and second latch circuits coupled to the respective first and second nodes; and a control circuit configured to: precharge the bit line and the first and second nodes by providing a precharge voltage to the first node coupled to the bit line and turning on the switching element, and electrically isolate, after the precharge, the first node from the bit line while controlling the first and second latch circuits to latch logic levels of the respective first and second nodes. The control circuit may be further configured to turn off the switching element after the precharge and before electrical isolation of the first node from the bit line. The logic levels which were latched may be utilized for a double sensing operation on a memory cell of the cell string.

In accordance with the present embodiments, the nonvolatile memory device may divide the sensing node of the page buffer for sensing the program state of a memory cell into two nodes which are selectively coupled according to a control signal, and control the two nodes to have a voltage level interval according to a preset ratio as a result for one sensing operation, thereby performing the double sensing operation using two sensing voltages at a time.

Such an operation can significantly reduce the time required for performing the double sensing operation.

DETAILED DESCRIPTION

Figure 1A:
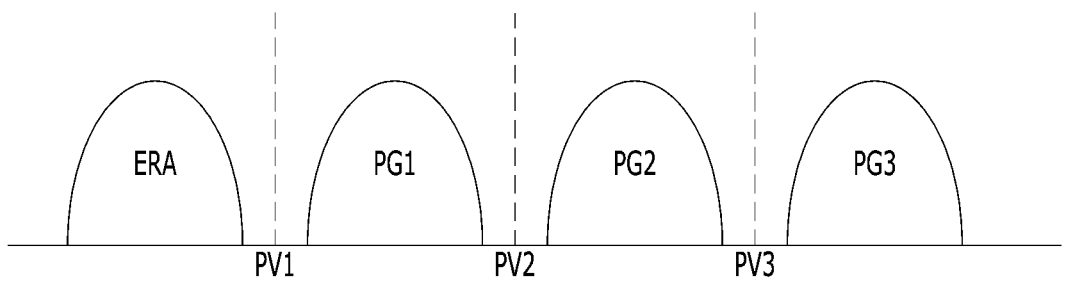
FIG. 1A is a diagram illustrating distributions of the threshold voltages of multi-level cells each capable of storing 2-bit data therein.

Various examples of the disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete, and fully conveys the disclosure to those skilled in the art to which the invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

FIG. 1A is a diagram illustrating distributions of the threshold voltages of multi-level cells each capable of storing 2-bit data therein.

As illustrated in FIG. 1, memory cells have different threshold voltages depending on the program states of the memory cells. The threshold voltage levels of memory cells in an erase state ERA may be lower than a first voltage level PV1, the threshold voltage levels of memory cells in a first program state PG1 may be higher than the first voltage level PV1 and lower than a second voltage level PV2, the threshold voltage levels of memory cells in a second program state PG2 may be higher than the second voltage level PV2 and lower than a third voltage level PV3, and the threshold voltage levels of memory cells in a third program state PG3 may be lower than the third voltage level PV3. The erase state ERA and the first to third program states PG1 to PG3 indicate states in which data having different values are stored in the respective memory cells.

The first to third voltage levels PV1 to PV3 may serve as reference voltages for determining which state a memory cell has among the erase state ERA and the first to third program states PG1 to PG3. Therefore, a sensing operation using the first to third voltages PV1 to PV3 may be performed when verifying whether a memory cell was normally programmed or when reading data stored in a memory cell.

In an embodiment, a sensing operation during a program process for a memory cell may be performed as follows: a program pulse may be applied to a word line corresponding to a memory cell to be programmed, and a sensing voltage may be then applied to the word line corresponding to the memory cell to be programmed, in order to verify whether the memory cell was normally programmed. As the sensing voltage, the first to third voltages PV1 to PV3 may be used. When the program verification result indicates that the memory cell was not normally programmed, the program pulse may be further applied to the memory cell. When the program verification result indicates that the memory cell was normally programmed, the program operation for the memory cell may be ended.

In an embodiment, a sensing operation during a process of reading data stored in a memory cell may be performed as follows: a sensing voltage may be applied to a word line corresponding to a memory cell to be read, in order to read data stored in the memory cell. As the sensing voltage, the first to third voltages PV1 to PV3 may be used. The read result may indicate which state the data stored in the memory cell has among the erase state ERA and the first to third program states PG1 to PG3.

Since a multi-level cell has a plurality of threshold voltage distributions, the widths of the threshold voltage distributions based on the respective states ERA and PG1 to PG3 need to be narrowed, in order to secure a sufficient sensing margin when a sensing operation for each of the states is performed. Hereafter, a double sensing operation which is a method for narrowing the width of a threshold voltage distribution will be described with reference to FIG. 1B.

Figure 1B:
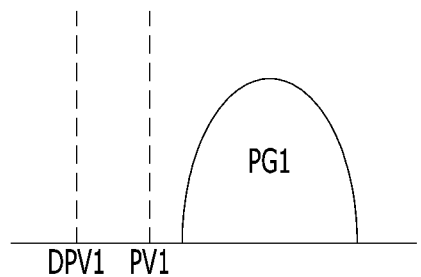
FIG. 1B is a diagram for describing a double sensing operation.

FIG. 1B is a diagram for describing a double sensing operation which is applied during a program process.

FIG. 1B shows how the double sensing operation is applied during a program process for a memory cell. For reference, FIG. 1B illustrates the case in which the memory cell is programmed into the first program state PG1 of FIG. 1A.

In the case of a program process using a single sensing operation, only the first voltage PV1 may be used as a sensing voltage to perform verification, in order to verify whether a memory cell was programmed into the first program state PG1. In the case of the program process using the double sensing operation, however, the first voltage PV1 and a first sub voltage DPV1 lower than the first voltage PV1 may be used together as sensing voltages to verify the threshold voltage of the memory cell two times, in order to check whether the memory cell was programmed in the first program state PG1.

In an embodiment, the program process using the double sensing operation may be performed as follows: a program pulse may be applied to a word line corresponding to a memory cell in the erase state ERA, which is to be programmed. After the program pulse is applied, the first sub voltage DPV1 may be used to verify whether the threshold voltage of the memory cell is higher than the first sub voltage DPV1, and the first voltage PV1 may be then used to verify whether the threshold voltage of the memory cell is higher than the first voltage PV1. Hereafter, in order to distinguish between the state in which program has been completed and the state in which program has not been completed but a memory cell is programmed to have a threshold voltage equal to or higher than the first sub voltage DPV1, the former state may be referred to as a target program state, and the latter state may be referred to as a sub program state.

When a verification result indicates that the threshold voltage of a memory cell is lower than the first sub voltage DPV1, a program pulse may be applied to the memory cell under the same condition as the previous condition. Furthermore, when the verification result indicates that the threshold voltage of the memory cell is higher than the first sub voltage DPV1 and lower than the first voltage PV1 (sub program state), the voltage of a bit line may be raised more than before, and a program pulse may be applied to the memory cell. When the verification result indicates that the threshold voltage of the memory cell is higher than the first voltage PV1 (target program state), an inhibit voltage may be applied to the bit line, and a program pulse may be applied to the memory cell.

Similarly, even when a memory cell is programmed into the second program state PG2, a second sub voltage lower than the second voltage PV2 and higher than the first voltage PV1 may be used to verify the memory cell two times. However, since the third program state PG3 is distributed at the rightmost, the width of the distribution of the threshold voltages does not need to be reduced. Thus, the verification through the double sensing operation may not be performed.

In general, when a program pulse is applied, the extent to which the threshold voltage of a memory cell is changed may be reduced as the voltage of a bit line is increased. Therefore, when a program pulse is applied to a memory cell whose threshold voltage does not correspond to the sub program state or the target program state, the threshold voltage of the memory cell may be significantly changed. When a program pulse is applied to a memory cell whose threshold voltage corresponds to the sub program state, the threshold voltage of the memory cell may be changed less than the threshold voltage of a memory cell in the erase state. Although a program pulse is applied to a memory cell whose threshold voltage corresponds to the program state, the threshold voltage of the memory cell may be hardly changed. Therefore, the width of the threshold voltages of memory cells in the first program state PG1 may be reduced. However, since the program process using the double sensing operation includes double verification operations using two sensing voltages in order to verify whether a memory cell was programmed into one program state, the time required for performing the double verification operations may be significantly increased.

Figure 2:
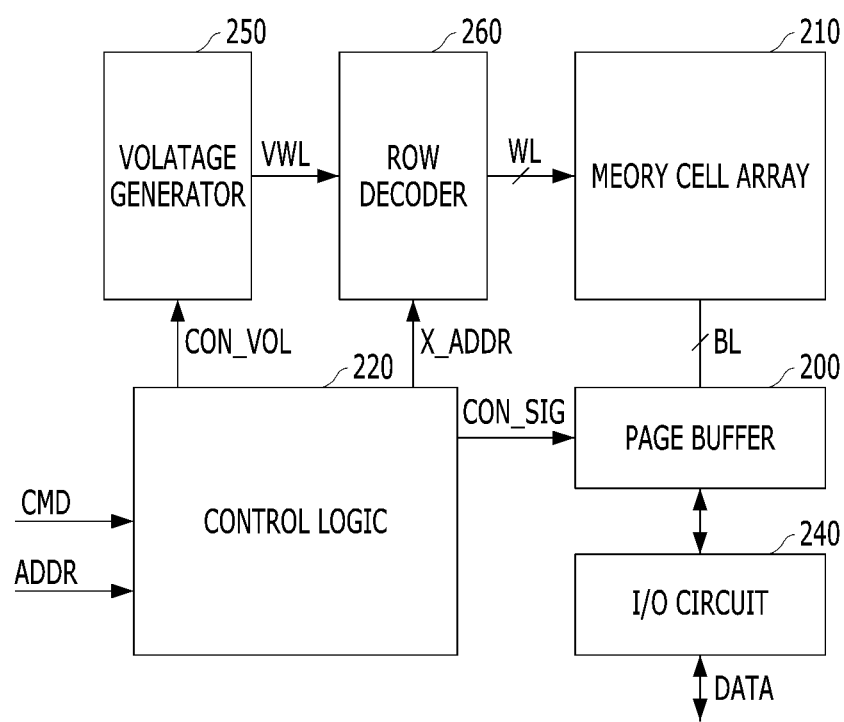
FIG. 2 is a diagram illustrating a configuration of a nonvolatile memory device in accordance with an embodiment.

FIG. 2 is a diagram illustrating a configuration of a nonvolatile memory device in accordance with an embodiment.

Referring to FIG. 2, the nonvolatile memory device may include a page buffer 200, a memory cell array 210, a control logic 220, a voltage generator 250, a row decoder 260 and an I/O (Input/Output) circuit 240.

First, the memory cell array 210 may include a plurality of memory cells. For example, the plurality of memory cells may be flash memory cells. Hereafter, the case in which the plurality of memory cells are cells of a NAND flash memory device will be taken as an example for description. However, the technical spirit of the present disclosure is not limited thereto. In another embodiment, the plurality of memory cells may be cells of a memory device such as a PRAM (Phase-change RAM), MRAM (Magnetic RAM), RRAM (Resistive RAM) or FRAM (Ferroelectric RAM).

The memory cell array 210 may be a 3D memory cell array. The 3D memory cell array may be formed at one or more physical levels of memory cell arrays each having an active region disposed on a silicon substrate and circuits formed on or in the substrate as circuits related to operations of memory cells. The layers at the respective levels, which constitute the memory cell array, may be stacked right over the layers at the bottom levels of the memory cell array. The 3D memory cell array may include NAND strings which are vertically disposed so that at least one memory cell is located over another memory cell. The at least one memory cell may include a charge trap layer. However, the present disclosure is not limited thereto. In another embodiment, the memory cell array 210 may be a 2D memory cell array.

In the present embodiment, each of the memory cells included in the memory cell array 210 may store 1-bit data or 2 or more-bit data therein. In general, a memory cell capable of storing 1-bit data therein may be referred to as an SLC (Single Level Cell), a memory cell capable of storing 2 or more-bit data therein may be referred to as an MLC (Multi Level Cell), a memory cell capable of storing 3-bit data therein may be referred to as a TLC (Triple Level Cell), a memory cell capable of storing 4-bit data therein may be referred to as a QLC (Quadruple Level Cell), and a memory cell capable of storing 5 or more-bit data therein may be referred to as a multiple level cell. The SLC may have an erase state and a program state according to the threshold voltage thereof, and the MLC, the TLC, the QLC and the multiple level cell may each have an erase state and a plurality of program states according to the threshold voltage thereof. The present disclosure is not limited thereto. In another embodiment, however, some memory cells of the memory cells included in the memory cell array 210 may be SLCs each capable of storing 1-bit data therein, and the other memory cells may be MLCs.

The control logic 220 may output various control signals X_ADDR, CON_SIG and CON_VOL for writing data to the memory cell array 210 or reading data from the memory cell array 210, based on a command CMD and an address ADDR which are received from an external memory controller.

The page buffer 200 may write input data to the memory cell array 210 in response to an operation control signal CON_SIG transferred from the control logic 220. For example, during a write operation, the page buffer 200 may transfer a bit line voltage, corresponding to data to be written, to a bit line BL of the memory cell array 210. Furthermore, the page buffer 200 may read or verify data stored in the memory cell array 210 in response to the operation control signal CON_SIG transferred from the control logic 220. For example, during a read operation or verify operation, the page buffer 200 may sense data stored in a selected memory cell through a bit line. The page buffer 200 may include a plurality of latch circuits, and latch the data sensed through the bit line during the read operation or the verify operation.

The voltage generator 250 may generate various types of voltages for performing write, read and erase operations on the memory cell array 210, based on a voltage control signal CON_VOL transferred from the control logic 220. For example, the voltage generator 250 may generate a word line voltage VWL, for example, a program voltage (or write voltage), a read voltage, a pass voltage (or word line unselect voltage), a verification voltage or a recovery voltage.

The row decoder 260 may select some word lines among a plurality of word lines WL included in the memory cell array 210, in response to a row address X-ADDR transferred from the control logic 220. The row decoder 260 may transfer the word line voltage to the word lines. For example, during a program operation, the row decoder 260 may apply the program voltage and the verification voltage to a selected word line, and apply a program inhibit voltage to an unselected word line. During a read operation, the row decoder 260 may apply the read voltage to a selected word line, and a read inhibit voltage to an unselected word line. During a recovery operation, the row decoder 260 may apply the recovery voltage to a selected word line. Furthermore, the row decoder 260 may select some string selection lines among string selection lines or some ground selection lines among ground selection lines, in response to the row address X-ADDR.

The I/O circuit 240 may receive data from the outside (for example, the memory controller), and transfer the received data to the page buffer 200 to store the received data in the memory cell array 210. The I/O circuit 240 may read data from the memory cell array 210 through the page buffer 200, and output the read data to the outside.

Figure 3:
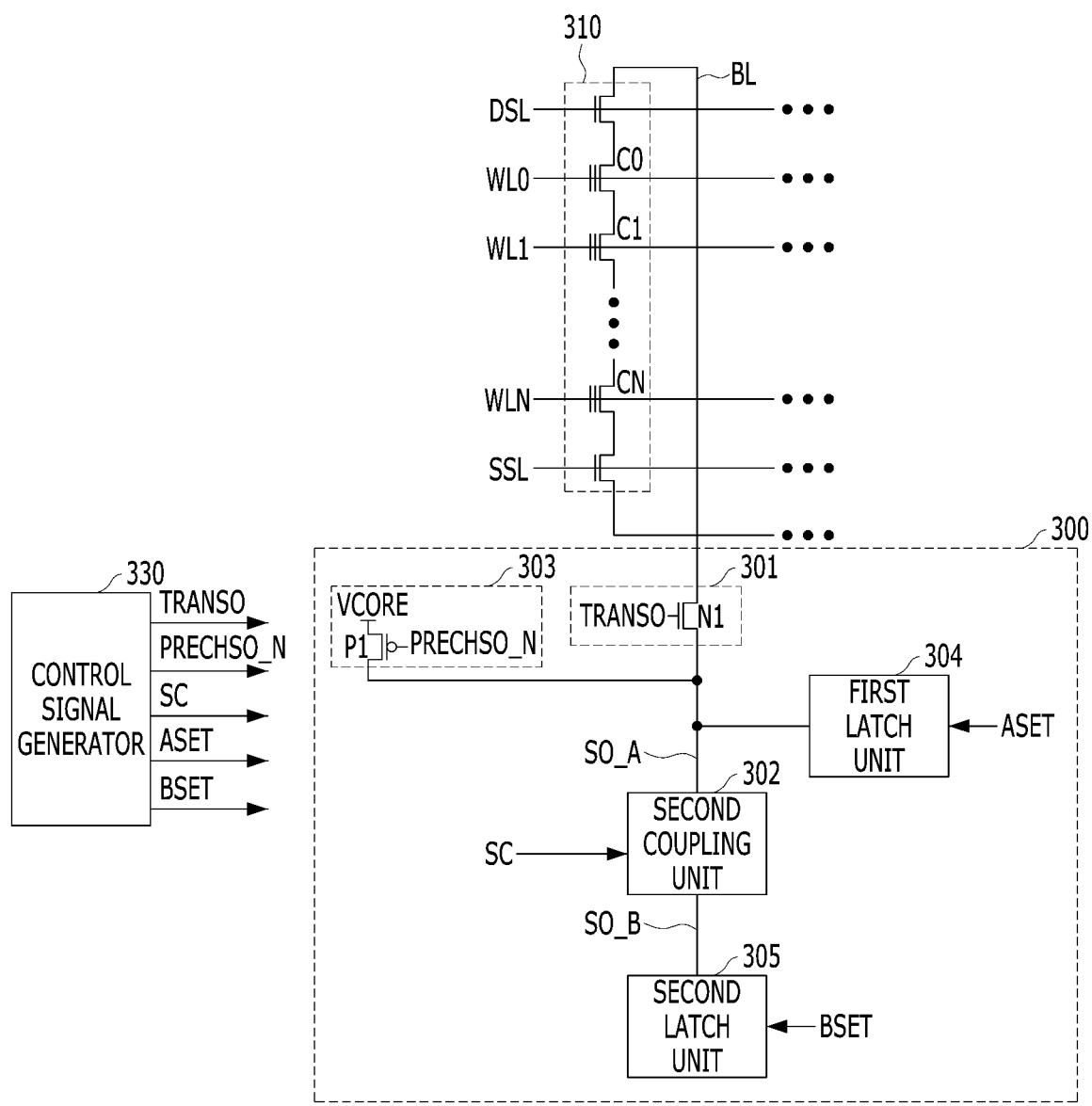
FIG. 3 is a diagram for describing a characteristic operation of the nonvolatile memory device of FIG. 2 in accordance with the present embodiment.

FIG. 3 is a diagram for describing a characteristic operation of the nonvolatile memory device of FIG. 2 in accordance with the present embodiment.

Referring to FIG. 3, the nonvolatile memory device in accordance with the present embodiment may include a cell string 310, a bit line BL, a control signal generator 330 and a page buffer 300. The page buffer 300 may include a first coupling unit 301, a second coupling unit 302, a third coupling unit 303, a first latch unit 304 and a second latch unit 305.

For reference, the cell string 310 and the bit line BL, which are illustrated in FIG. 3, may correspond to any one cell string which is representatively illustrated among a plurality of cell strings included in the memory cell array 210 illustrated in FIG. 2, and any one bit line which is representatively illustrated among a plurality of bit lines corresponding to the cell strings, respectively. Similarly, the page buffer 300 illustrated in FIG. 3 may be one page buffer which is specifically illustrated as an example and corresponds to one or more bit lines in the page buffer 200 illustrated in FIG. 2. Furthermore, the control signal generator 330 illustrated in FIG. 3 may be a component included in the control logic 220 illustrated in FIG. 2. In FIG. 2, the control signal transferred from the control logic 220 to the page buffer 200 is simply represented by 'CON_SIG'. In FIG. 3, however, the case in which the control signal generator 330 generates first to fifth control signals TRANSO, PRECHSO_N, SC, ASET and BSET and transfers the generated signals to the page buffer 300 will be taken as an example for description.

In an embodiment, the cell string 310 may include a plurality of memory cells C0 to CN coupled in series. The cell string 310 may refer to a string structure in which the plurality of memory cells C0 to CN are coupled in series between a source selection transistor configured to receive SSL and a drain selection transistor configured to receive DSL. Various voltages may be applied to floating gates of the plurality of memory cells C0 to CN by a plurality of word lines WL0 to WLN.

The bit line BL may be coupled to the cell string 310.

The control signal generator 330 may generate a plurality of control signals for controlling the operation of the page buffer 300, for example, a first control signal TRANSO, a second control signal SC, a third control signal ASET, a fourth control signal BSET and a fifth control signal PRECHSO_N. For reference, FIG. 3 illustrates that the control signal generator 330 generates five signals TRANSO, SC, ASET, BSET and PRECHSO_N to control the operation of the page buffer 300, but this is only one embodiment. Depending on design, the control signal generator 330 may generate different types or different numbers of signals to control the operation of the page buffer 300.

The page buffer 300 may precharge the bit line BL, a first sensing node SO_A and a second sensing node SO_B to a preset level, and then double-sense the bit line BL through the first and second sensing nodes SO_A and SO_B.

In an embodiment, the first coupling unit 301 included in the page buffer 300 may couple the bit line BL and the first sensing node SO_A in response to the first control signal TRANSO. The first coupling unit 301 may include an NMOS transistor N1 configured to selectively couple the bit line BL and the first sensing node SO_A, which are connected to drain and source thereof, in response to the first control signal TRANSO applied to a gate thereof.

The second coupling unit 302 included in the page buffer 300 may couple the first and second sensing nodes SO_A and SO_B in response to the second control signal SC, and control the first and second sensing nodes SO_A and SO_B to have a voltage level interval according to a preset ratio in a second period.

The first latch unit 304 included in the page buffer 300 may latch a logic level corresponding to the voltage level of the first sensing node SO_A in response to the third control signal ASET.

The second latch unit 305 included in the page buffer 300 may latch a logic level corresponding to the voltage level of the second sensing node SO_B in response to the fourth control signal BSET.

The third coupling unit 303 included in the page buffer 300 may selectively couple a core voltage terminal VCORE and the first sensing node SO_A in response to the fifth control signal PRECHSO_N.

The third coupling unit 303 may include a PMOS transistor P1 configured to selectively couple the core voltage terminal VCORE and the first sensing node SO_A, which are connected to drain and source thereof, in response to the fifth control signal PRECHSO_N applied to a gate thereof.

Figure 4:
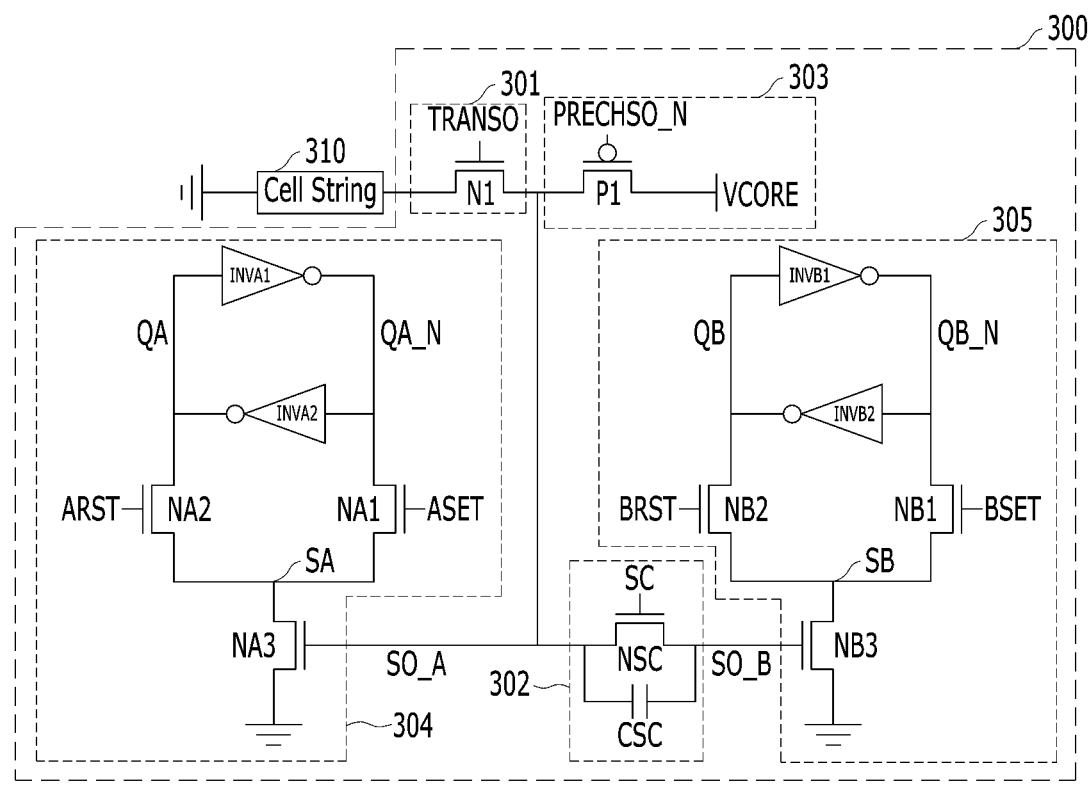
FIG. 4 is a diagram illustrating a configuration of a page buffer included in the nonvolatile memory device illustrated in FIG. 3 in accordance with the present embodiment.

FIG. 4 is a diagram illustrating a configuration of the page buffer included in the nonvolatile memory device of FIG. 3 in accordance with the present embodiment.

FIG. 4 illustrates the detailed configuration of the page buffer 300 illustrated in FIG. 3.

In an embodiment, the page buffer 300 may include the first coupling unit 301, the second coupling unit 302, the third coupling unit 303, the first latch unit 304 and the second latch unit 305.

The first coupling unit 301 included in the page buffer 300 may couple the bit line BL and the first sensing node SO_A in response to the first control signal TRANSO. The first coupling unit 301 may include the NMOS transistor N1 configured to selectively couple the bit line BL and the first sensing node SO_A, which are connected to drain and source thereof, in response to the first control signal TRANSO applied to a gate thereof.

The second coupling unit 302 included in the page buffer 300 may couple the first and second sensing nodes SO_A and SO_B in response to the second control signal SC, and control the first and second sensing nodes SO_A and SO_B to have the voltage level interval according to the preset ratio in the second period. In an embodiment, the second coupling unit 302 may include a switch NSC and a capacitor CSC. The switch NSC may selectively couple the first and second sensing nodes SO_A and SO_B in response to the second control signal SC. The switch NSC may be an NMOS transistor configured to selectively couple the first sensing node SO_A and the second sensing node SO_B, which are connected to drain and source thereof, in response to the second control signal SC applied to a gate thereof. The capacitor CSC may be coupled in parallel to the switch NSC between the first and second sensing nodes SO_A and SO_B.

The first latch unit 304 included in the page buffer 300 may latch a logic level corresponding to the voltage level of the first sensing node SO_A in response to the third control signal ASET. In an embodiment, the first latch unit 304 may include a first latch inverter INVA1, a first inversion latch inverter INVA2, an NMOS transistor NA1, an NMOS transistor NA2 and an NMOS transistor NA3. The first latch inverter INVA1 may have an input terminal coupled to a first latching node QA and an output terminal coupled to a first inversion latching node QA_N. The first inversion latch inverter INVA2 may have an input terminal coupled to the first inversion latching node QA_N and an output terminal coupled to the first latching node QA. The NMOS transistor NA1 may selectively couple the first inversion latching node QA_N and a first sourcing node SA, which are connected to drain and source thereof, in response to the third control signal ASET applied to a gate thereof. The NMOS transistor NA2 may selectively couple the first latching node QA and the first sourcing node SA, which are connected to drain and source thereof, in response to an inverted signal ARST of the third control signal ASET applied to a gate thereof. The NMOS transistor NA3 may control the amount of current flowing between the first sourcing node SA and a ground voltage terminal VSS, which are connected to drain and source thereof, according to the voltage level of the first sensing node SO_A connected to a gate thereof.

The second latch unit 305 included in the page buffer 300 may latch a logic level corresponding to the voltage level of the second sensing node SO_B in response to the fourth control signal BSET. In an embodiment, the second latch unit 305 may include a second latch inverter INVB1, a second inversion latch inverter INVB2, an NMOS transistor NB1, an NMOS transistor NB2 and an NMOS transistor NB3. The second latch inverter INVB1 may have an input terminal coupled to a second latching node QB and an output terminal coupled to a second inversion latching node QB_N. The second inversion latch inverter INVB2 may have an input terminal coupled to the second inversion latching node QB_N and an output terminal coupled to the second latching node QB. The NMOS transistor NB1 may selectively couple the second inversion latching node QB_N and a second sourcing node SB, which are connected to drain and source thereof, in response to the fourth control signal BSET applied to a gate thereof. The NMOS transistor NB2 may selectively couple the second latching node QB and the second sourcing node SB, which are connected to drain and source thereof, in response to an inverted signal BRST of the fourth control signal BSET applied to a gate thereof. The NMOS transistor NB3 may control the amount of current flowing between the second sourcing node SB and the ground voltage terminal VSS, which are connected to drain and source thereof, according to the voltage level of the second sensing node SO_B connected to a gate thereof.

The third coupling unit 303 included in the page buffer 300 may selectively couple the core voltage terminal VCORE and the first sensing node SO_A in response to the fifth control signal PRECHSO_N. The third coupling unit 303 may include the PMOS transistor P1 configured to selectively couple the core voltage terminal VCORE and the first sensing node SO_A, which are connected to drain and source thereof, in response to the fifth control signal PRECHSO_N applied to a gate thereof.

Figure 5:
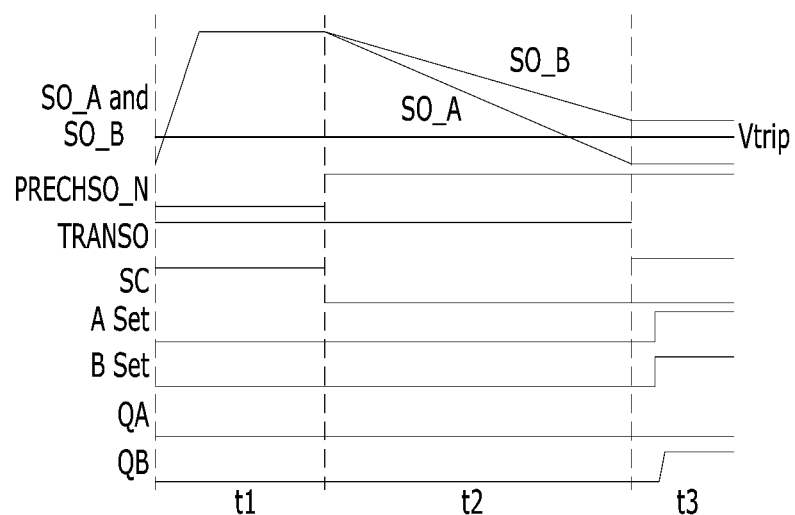
FIG. 5 is a diagram for describing an example of an operation of the nonvolatile memory device in accordance with the present embodiment.

FIG. 5 is a diagram for describing an example of an operation of the nonvolatile memory device in accordance with the present embodiment.

FIG. 5 illustrates an example of a double sensing operation which is performed by the page buffer included in the nonvolatile memory device in accordance with the present embodiment.

In an embodiment, the page buffer 300 included in the nonvolatile memory device may precharge the bit line BL, the first sensing node SO_A and the second sensing node SO_B to a preset level in a first period t1, and then double-sense the bit line BL through the first and second sensing nodes SO_A and SO_B in a second period t2 and t3.

The control signal generator 330 included in the nonvolatile memory device may activate the first control signal TRANSO, the second control signal SC and the fifth control signal PRECHSO_N in the first period t1. The control signal generator 330 may deactivate the second control signal SC and the fifth control signal PRECHSO_N and activate the first control signal TRANSO, in a third period t2 included in the second period t2 and t3. The control signal generator 330 may deactivate the first control signal TRANSO, the second control signal SC and the fifth control signal PRECHSO_N and toggle the third control signal ASET and the fourth control signal BSET, in a fourth period t3 included in the second period t2 and t3, after the third period t2.

In response to the above-described operation of the control signal generator 330 to generate the first to fifth control signals TRANSO, SC, ASET, BSET and PRECHSO_N, the page buffer 300 may operate as follows.

First, in the first period t1, the page buffer 300 may couple the bit line BL, the first sensing node SO_A, the second sensing node SO_B and the core voltage terminal VCORE through the first to third coupling units 301 to 303, thereby precharging the bit line BL, the first sensing node SO_A and the second sensing node SO_B to the core voltage level VCORE. That is, the first period t1 may be a precharge period.

In the third period t2, the page buffer 300 may decouple the first sensing node SO_A from the core voltage terminal VCORE through the third coupling unit 303, and couple the bit line BL and the first sensing node SO_A through the first coupling unit 301, thereby evaluating the voltage levels of the bit line BL and the first sensing node SO_A. That is, the third period t2 may be an evaluation period of the bit line BL and the first sensing node SO_A.

Furthermore, in the third period t2, the page buffer 300 may couple the first and second sensing nodes SO_A and SO_B through the capacitor CSC included in the second coupling unit 302, and thus control the first and second sensing nodes SO_A and SO_B to have a voltage level interval according to a preset ratio. That is, in the third period t2, the page buffer 300 may turn off the switch NSC included in the second coupling unit 302, and thus control the first and second sensing nodes SO_A and SO_B to be coupled through the capacitor CSC coupled in parallel to the switch NSC between the first and second sensing nodes SO_A and SO_B.

In the evaluation period of the bit line BL and the first sensing node SO_A after the precharge period, i.e., in the third period t2, the voltage level of the bit line BL may be varied depending on the state of a target cell included in the cell string 310. As a result, the voltage level of the first sensing node SO_A which is electrically coupled to the bit line BL through the first coupling unit 301 may be varied as illustrated in FIG. 5.

For example, FIG. 5 may be based on the supposition that a specific sensing voltage (for example, PV1) (see FIG. 1) is applied to a selected word line (for example, target word line WL0) (see FIG. 3), and the pass voltage is applied to the other word lines. In such a state, when the threshold voltage of a target cell C0 coupled to the target word line WL0 is lower than PV1 and higher than DPV1 or lower than DPV1, the target cell C0 may be turned on so that a current flow from the bit line BL to the ground voltage terminal VSS. Thus, the voltage level of the bit line BL, which has risen to a preset level in the first period t1, may become lower than the preset level in the third period t2. As a result, in the third period t2, the voltage level of the first sensing node SO_A may be lowered as illustrated in FIG. 5.

At this time, the target cell C0 whose threshold voltage is lower than PV1 and higher than DPV1 in the third period t2 may be turned on less than the target cell C0 whose threshold voltage is lower than DPV1. In this case, a relatively small current may flow from the bit line BL to the ground voltage terminal VSS. Therefore, the slope of the voltage level of the bit line BL, which is lowered by the target cell C0 whose threshold voltage is lower than PV1 and higher than DPV1 in the third period t2, may be smaller than the slope of the voltage level of the bit line BL, which is lowered by the target cell C0 whose threshold voltage is lower than DPV1. That is, a level which is decided after the voltage level of the first sensing node SO_A was lowered by the target cell C0 whose threshold voltage is lower than PV1 and higher than DPV1 during the third period t2 may be higher than a level which is decided after the voltage level of the first sensing node SO_A was lowered by the target cell C0 whose threshold voltage is lower than DPV1 during the third period t2.

Furthermore, in the third period t2, the switch NSC between the first sensing node SO_A and the second sensing node SO_B may be turned off so that the first and second sensing nodes SO_A and SO_B are coupled through the capacitor CSC. Therefore, the voltage level of the second sensing node SO_B may be lowered while having a voltage level interval from the voltage level of the first sensing node SO_A according to the preset ratio as illustrated in FIG. 5.

For example, when it is assumed that the voltage level of the first sensing node SO_A is lowered with a first slope in response to the voltage level of the bit line BL, which is lowered by the target cell C0 whose threshold voltage is lower than PV1 and higher than DPV1, in the third period t2, the voltage level of the second sensing node SO_B may be lowered with a second slope. At this time, the first slope may be larger than the second slope, and the slope difference therebetween may be changed according to the capacitance value of the capacitor CSC coupled between the first and second sensing nodes SO_A and SO_B. Furthermore, when it is assumed that the voltage level of the first sensing node SO_A is lowered with a third slope in response to the voltage level of the bit line BL, which is lowered by the target cell C0 whose threshold voltage is lower than DPV1, in the third period t2, the voltage level of the second sensing node SO_B may be lowered with a fourth slope. At this time, the third slope may be larger than the fourth slope, and the slope difference therebetween may be changed according to the capacitance value of the capacitor CSC coupled between the first and second sensing nodes SO_A and SO_B.

When the capacitor CSC coupled between the first and second sensing nodes SO_A and SO_B has a constant capacitance value, the slope of the voltage level of the bit line BL, which is lowered by the target cell C0 whose threshold voltage is lower than PV1 and higher than DPV1, is smaller than the slope of the voltage level of the bit line BL, which is lowered by the target cell C0 whose threshold voltage is lower than DPV1. Thus, the first slope may be smaller than the third slope, and the second slope may be smaller than the fourth slope.

When the threshold voltage of the target cell C0 coupled to the target word line WL0 is higher than PV1, the target cell C0 may be turned off so that no current flows from the bit line BL to the ground voltage terminal VSS. In this case, the voltage level of the bit line BL may be retained substantially as it is. As a result, the voltage level of the first sensing node SO_A may be retained substantially as it is, unlike the voltage level illustrated in FIG. 5. Therefore, the voltage level of the second sensing node SO_B may also be retained substantially as it is.

The page buffer 300 may decouple the first sensing node SO_A from the bit line BL through the first coupling unit 301 in the fourth period t3. The page buffer 300 may decouple the first sensing node SO_A from the core voltage terminal VCORE through the third coupling unit 303 in the fourth period t3. The page buffer 300 may latch a logic level, corresponding to the voltage level of the first sensing node SO_A, in the first latch unit 304 in response to the third control signal ASET which toggles in the fourth period t3. Furthermore, the page buffer 300 may latch a logic level, corresponding to the voltage level of the second sensing node SO_B, in the second latch unit 305 in response to the fourth control signal BSET which toggles in the fourth period t3.

As described above, the page buffer 300 may control the first and second sensing nodes SO_A and SO_B to have a voltage level interval according to the preset ratio in the third period t2. Therefore, the page buffer 300 may latch, as different values, a logic level corresponding to the voltage level of the first sensing node SO_A and a logic level corresponding to the voltage level of the second sensing node SO_B in the fourth period t3 as illustrated in FIG. 5. That is, the page buffer 300 may double-sense the state of the target cell based on different sensing voltage levels of the first and second sensing nodes SO_A and SO_B in the second period t2 and t3.

For example, it may be assumed that the first and second latch units 304 and 305 decide logic levels corresponding to the voltage levels of the first and second sensing nodes SO_A and SO_B, based on the same trip voltage level Vtrip, as illustrated in FIG. 5. Furthermore, it may be assumed that the voltage level of the first sensing node SO_A is varied to a lower level than the trip voltage level Vtrip, and the voltage level of the second sensing node SO_B is varied to a higher level than the trip voltage level Vtrip, in the third period t2 as illustrated in FIG. 5. In this case, in the fourth period t3, the logic level of the first sensing node SO_A, latched in the first latching node QA of the first latch unit 304, may become logic 'low', and the logic level of the second sensing node SO_B, latched in the second latching node QB of the second latch unit 305, may become logic 'high', such that the first and second latch units 304 and 305 latch different logic levels.

When the voltage levels of the first and second sensing nodes SO_A and SO_B are retained substantially as they are in the third period t2, the page buffer 300 may latch logic levels, corresponding to the respective voltage levels of the first and second sensing nodes SO_A and SO_B, as the same value in the fourth period t3, unlike the logic levels illustrated in FIG. 5.

Figure 6A:
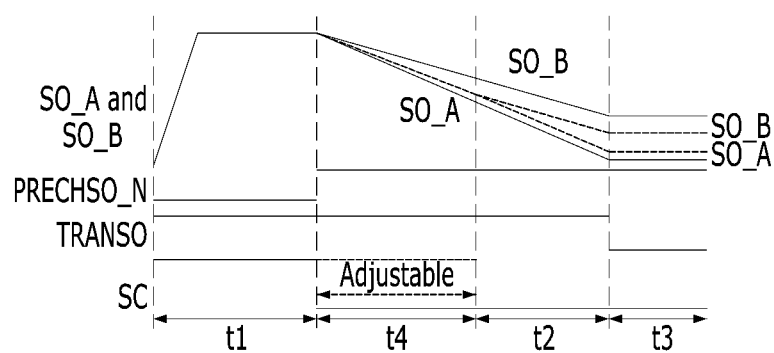
FIGS. 6A and 6B are diagrams for describing another example of the operation of the nonvolatile memory device in accordance with the present embodiment.
Figure 6B:
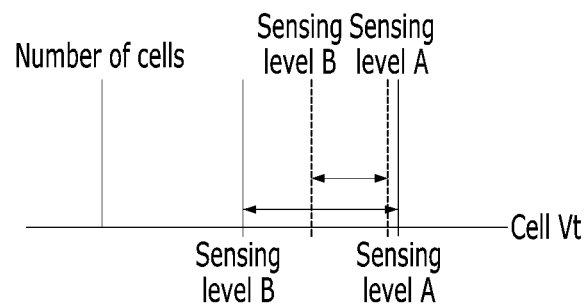

FIGS. 6A and 6B are diagrams for describing another example of the operation of the nonvolatile memory device in accordance with the present embodiment.

FIGS. 6A and 6B illustrate another example of the double sensing operation which is performed by the page buffer included in the nonvolatile memory device in accordance with the present embodiment.

For reference, the double sensing operation performed by the page buffer 300 illustrated in FIGS. 6A and 6B is different from the double sensing operation performed by the page buffer 300 illustrated in FIG. 5 in that a second period of the double sensing operation of FIGS. 6A and 6B is divided into three periods, i.e., a third period t2, a fourth period t3 and a fifth period t4, while the second period t2 and t3 of the double sensing operation of FIG. 5 is divided into two periods. Therefore, the following descriptions will be focused on differences between the double sensing operation performed by the page buffer 300 illustrated in FIG. 5 and the double sensing operation performed by the page buffer 300 illustrated in FIGS. 6A and 6B, and the overlapping contents thereof will be omitted herein.

Referring to FIG. 6A, the control signal generator 330 included in the nonvolatile memory device may activate the first control signal TRANSO, the second control signal SC and the fifth control signal PRECHSO_N in a first period t1. Furthermore, the control signal generator 330 may deactivate the second control signal SC and the fifth control signal PRECHSO_N and activate the first control signal TRANSO, in a third period t2 included in a second period t2, t3 and t4. The control signal generator 330 may deactivate the first control signal TRANSO, the second control signal SC and the fifth control signal PRECHSO_N and toggle the third control signal ASET and the fourth control signal BSET, in a fourth period t3 included in the second period t2, t3 and t4, after the third period t2. Furthermore, the control signal generator 330 may activate the first control signal TRANSO and the second control signal SC and deactivate the fifth control signal PRECHSO_N, in a fifth period t4 which is included in the second period t2, t3 and t4 and precedes the third period t2. Furthermore, by adjusting the length of the period in which the second control signal SC is activated while the first control signal TRANSO is activated and the fifth control signal PRECHSO_N is deactivated, the control signal generator 330 may adjust the length of the fifth period t4 as indicated by a dotted line in FIG. 6A.

In response to the above-described operation of the control signal generator 330 to generate the first to fifth control signals TRANSO, SC, ASET, BSET and PRECHSO_N, the page buffer 300 may operate as follows.

In the first period t1, the page buffer 300 may couple the bit line BL, the first sensing node SO_A, the second sensing node SO_B and the core voltage terminal VCORE through the first to third coupling units 301 to 303, thereby precharging the bit line BL, the first sensing node SO_A and the second sensing node SO_B to the core voltage level VCORE. That is, the first period t1 may be a precharge period.

In the fifth period t4, the page buffer 300 decouple the first sensing node SO_A from the core voltage terminal VCORE through the third coupling unit 303, and couple the bit line BL to the first and second sensing nodes SO_A and SO_B through the first and second coupling units 301 and 302, thereby evaluating the voltage levels of the bit line BL and the first and second sensing nodes SO_A and SO_B. That is, the fifth period t4 may be an evaluation period of the bit line BL and the first and second sensing nodes SO_A and SO_B.

In the third period t2, the page buffer 300 may decouple the first sensing node SO_A from the core voltage terminal VCORE through the third coupling unit 303, and couple the bit line BL and the first sensing node SO_A through the first coupling unit 301, thereby evaluating the voltage levels of the bit line BL and the first sensing node SO_A. That is, the third period t2 may be an evaluation period of the bit line BL and the first sensing node SO_A.

In the third period t2, the page buffer 300 may couple the first and second sensing nodes SO_A and SO_B through the capacitor CSC included in the second coupling unit 302, and thus control the first and second sensing nodes SO_A and SO_B to have a voltage level interval according to a preset ratio. That is, in the third period t2, the page buffer 300 may turn off the switch NSC included in the second coupling unit 302, and thus control the first and second sensing nodes SO_A and SO_B to be coupled through the capacitor CSC coupled in parallel to the switch NSC.

In the evaluation period of the bit line BL and the first and second sensing nodes SO_A and SO_B after the precharge period, i.e., in the fifth period t4, the voltage level of the bit line BL may be varied depending on the state of a target cell included in the cell string 310. As a result, the voltage levels of the first and second sensing nodes SO_A and SO_B which are electrically coupled to the bit line BL through the first and second coupling units 301 and 302 may be varied as indicated by dotted lines in FIG. 6A.

For example, it may be assumed that that a specific sensing voltage (for example, PV1) (see FIG. 1) is applied to a selected word line (for example, target word line WL0) (see FIG. 3), and the pass voltage is applied to the other word lines. In such a state, when the threshold voltage of a target cell C0 coupled to the target word line WL0 is lower than PV1 and higher than DPV1 and when the threshold voltage of the target cell C0 coupled to the target word line WL0 is lower than DPV1, the target cell C0 may be turned on so that a current flow from the bit line BL to the ground voltage terminal VSS. Thus, the voltage level of the bit line BL, which has risen to a preset level in the first period t1, may become lower than the preset level in the fifth period t4. As a result, in the fifth period t4, the voltage levels of the first and second sensing nodes SO_A and SO_B may be lowered as indicated by the dotted lines in FIG. 6A.

At this time, the target cell C0 whose threshold voltage is lower than PV1 and higher than DPV1 in the fifth period t4 may be turned on less than the target cell C0 whose threshold voltage is lower than DPV1. Thus, a relatively small current may flow from the bit line BL to the ground voltage terminal VSS. Therefore, the slope of the voltage level of the bit line BL, which is lowered by the target cell C0 whose threshold voltage is lower than PV1 and higher than DPV1 in the fifth period t4, may be smaller than the slope of the voltage level of the bit line BL, which is lowered by the target cell C0 whose threshold voltage is lower than DPV1. That is, a level which is decided after the voltage level of the first sensing node SO_A was lowered by the target cell C0 whose threshold voltage is lower than PV1 and higher than DPV1 during the fifth period t4 may be higher than a level which is decided after the voltage level of the first sensing node SO_A was lowered by the target cell C0 whose threshold voltage is lower than DPV1 during the fifth period t4.

In the fifth period t4, the switch NSC between the first sensing node SO_A and the second sensing node SO_B may be turned on so that the first and second sensing nodes SO_A and SO_B are electrically coupled to each other. Therefore, as illustrated in FIG. 6A, the voltage level of the second sensing node SO_B may be lowered with the same slope as the voltage level of the first sensing node SO_A. That is, in the fifth period t4, the voltage levels of the first and second sensing nodes SO_A and SO_B may be lowered with slopes indicated by the dotted lines in FIG. 6A, in response to the lowered voltage level of the bit line BL.

In the evaluation period of the bit line BL and the first sensing node SO_A after the fifth period t4, i.e., in the third period t2, the switch NSC between the first and second sensing nodes SO_A and SO_B may be turned off, and the first and second sensing nodes SO_A and SO_B may be coupled through the capacitor CSC.

Therefore, as indicated by the dotted line in FIG. 6A, the voltage level of the second sensing node SO_B may be lowered while having a voltage level interval from the voltage level of the first sensing node SO_A according to the preset ratio. That is, until the fifth period t4, the voltage levels of the first and second sensing nodes SO_A and SO_B may be lowered with the same slope in response to the lowered voltage level of the bit line BL. In the third period t2, however, the voltage levels of the first and second sensing nodes SO_A and SO_B may be lowered with different slopes.

For example, when it is assumed that the voltage level of the first sensing node SO_A is lowered with a first slope in response to the voltage level of the bit line BL, which is lowered by the target cell C0 whose threshold voltage is lower than PV1 and higher than DPV1, in the third period t2, the voltage level of the second sensing node SO_B may be lowered with a second slope. At this time, the first slope may be larger than the second slope, and the slope difference therebetween may be changed according to the capacitance value of the capacitor CSC coupled between the first and second sensing nodes SO_A and SO_B. Furthermore, when it is assumed that the voltage level of the first sensing node SO_A is lowered with a third slope in response to the voltage level of the bit line BL, which is lowered by the target cell C0 whose threshold voltage is lower than DPV1, in the third period t2, the voltage level of the second sensing node SO_B may be lowered with a fourth slope. At this time, the third slope may be larger than the fourth slope, and the slope difference therebetween may be changed according to the capacitance value of the capacitor CSC coupled between the first and second sensing nodes SO_A and SO_B.

When the capacitor CSC coupled between the first and second sensing nodes SO_A and SO_B has a constant capacitance value, the slope of the voltage level of the bit line BL, which is lowered by the target cell C0 whose threshold voltage is lower than PV1 and higher than DPV1, is smaller than the slope of the voltage level of the bit line BL, which is lowered by the target cell C0 whose threshold voltage is lower than DPV1. Thus, the first slope may be smaller than the third slope, and the second slope may be smaller than the fourth slope.

Furthermore, referring to FIGS. 6A and 6B, the control signal generator 330 may adjust the length of the fifth period t4 by adjusting the length of the period in which the second control signal SC is activated as indicated by the dotted line in FIG. 6A, in the state in which the first control signal TRANSO is activated and the fifth control signal PRECH-SO_N is deactivated, i.e., in the state after the first period t1. In response to the operation of the control signal generator 330 to adjust the length of the activation period of the second control signal SC, the page buffer 300 may adjust the preset ratio to decide the voltage level interval between the first and second sensing nodes SO_A and SO_B. That may be because, while the voltage levels of the first and second sensing nodes SO_A and SO_B are varied with the same slope in the fifth period t4, the voltage levels of the first and second sensing nodes SO_A and SO_B are varied with different slopes in the third period t3.

That is, depending on how long the control signal generator 330 retains the activation period of the second control signal SC while the first control signal TRANSO is activated and the fifth control signal PRECHSO_N is deactivated, the ratio of the length of the third period t2 to the length of the fifth period t4 in the second period t2, t3 and t4 may be decided, and used as the preset ratio.

For example, the page buffer 300 may control the first and second sensing nodes SO_A and SO_B to have a greater voltage level interval by decreasing the length of the fifth period t4 of the second period t2, t3 and t4 and increasing the length of the third period t2. On the other hand, the page buffer 300 may control the first and second sensing nodes SO_A and SO_B to have a smaller voltage level interval by increasing the length of the fifth period t4 of the second period t2, t3 and t4 and decreasing the length of the third period t2.

In FIGS. 6A and 6B, solid lines may show that the double sensing operation is performed in the same manner as the double sensing operation of the page buffer 300 described with reference to FIG. 5. That is, the solid lines may show that the length of the fifth period t4 of the second period t2, t3 and t4 is zero, and the length of the third period t2 is the maximum. Furthermore, in FIGS. 6A and 6B, the dotted lines may show that the length of the fifth period t4 of the second period t2, t3 and t4 is almost similar to the length of the third period t2 thereof, which indicates that the length of the third period t2 has been significantly reduced compared to that shown by the solid lines. Therefore, the voltage level interval between the first and second sensing nodes SO_A and SO_B indicated by the solid lines in FIGS. 6A and 6B may be larger than the voltage level interval between the first and second sensing nodes SO_A and SO_B indicated by the dotted lines in FIGS. 6A and 6B.

Figure 7A:
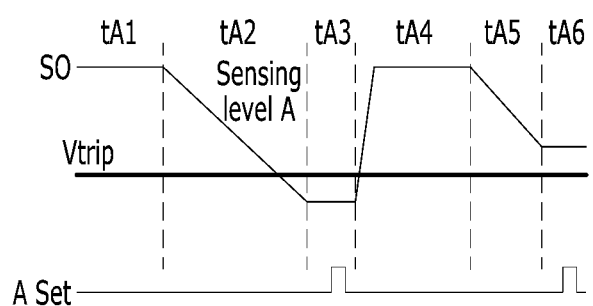
FIGS. 7A and 7B are diagrams for comparing and describing the operation of the nonvolatile memory device in accordance with the present embodiment and an operation of a nonvolatile memory device according to the related art.
Figure 7B:
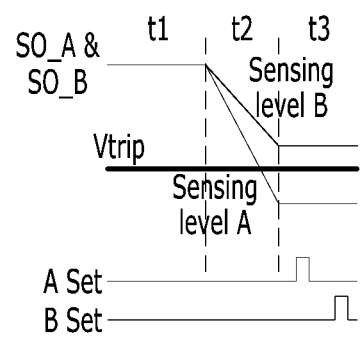

FIGS. 7A and 7B are diagrams for comparing and describing the operation of the nonvolatile memory device in accordance with the present embodiment and an operation of a nonvolatile memory device according to the related art.

First, FIG. 7A shows that the nonvolatile memory device according to the related art performs two verifications using two sensing voltages, in order to perform the double sensing operation.

FIG. 7A illustrates that the length of an evaluation period tA2 in a first verify operation and the length of an evaluation period tA5 in a second verify operation are differently set to control the two sensing voltages to have different levels, when the double sensing operation is performed on one target cell.

In an embodiment, the first verify operation may include a first precharge period tA1, a first evaluation period tA2 and a first latch period tA3. That is, the first verify operation may include precharging a sensing node SO to the core voltage level in the first precharge period tA1, evaluating the voltage levels of the sensing node SO and the bit line BL in the first evaluation period tA2, and latching a logic level corresponding to the voltage level of the sensing node SO in the first latch period tA3. At this time, the length of the first evaluation period tA2 may be retained as a large length enough to sufficiently lower the level of the sensing node SO in response to the state of a cell (a turn-on state under the supposition that a predetermined amount of current flows from the sensing node to the bit line). Thus, the logic level of the sensing node SO, latched in the first latch period tA3, may become logic 'low'.

The second verify operation may include a second precharge period tA4, a second evaluation period tA5 and a second latch period tA6. That is, the second verify operation may include precharging the sensing node SO to the core voltage level in the second precharge period tA4, evaluating the voltage levels of the sensing node SO and the bit line BL in the second evaluation period tA5, and latching a logic level corresponding to the voltage level of the sensing node SO in the second latch period tA6. At this time, the length of the second evaluation period tA5 may be retained as a smaller length than the length of the first evaluation period tA2, such that the level of the sensing node SO is lowered but is not lower than in the first evaluation period tA2, in response to the state of the cell (the turn-on state under the supposition that a predetermined amount of current flows from the sensing node to the bit line). Thus, the logic level of the sensing node SO, latched in the second latch period tA6, may become logic 'high'.

FIG. 7B shows that the nonvolatile memory device in accordance with the present embodiment performs one verification using two sensing voltages at the same time, in order to perform the double sensing operation.

FIG. 7B shows that the first and second sensing nodes SO_A and SO_B have a voltage level interval according to the preset ratio in an evaluation period t2 included in one verify operation, when the double sensing operation is performed on one target cell. Therefore, in FIG. 7B, the nonvolatile memory device may perform one verification using two sensing voltages at the same time through one latch period t3 after one evaluation period t2.

In this way, the comparison between FIGS. 7A and 7B shows that the nonvolatile memory device in accordance with the present embodiment can significantly reduce the time required for the double sensing operation in comparison to the nonvolatile memory device according to the related art, when performing the double sensing operation.

For reference, since the detailed descriptions of the operation corresponding to FIG. 7B are included in the descriptions of FIGS. 2 to 6, the detailed descriptions thereof will be omitted herein.

Figure 8A:
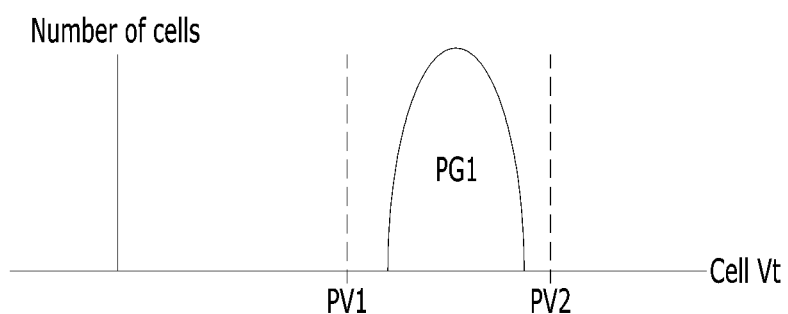
FIG. 8A is a diagram for describing a double sensing operation applied during a read process.

FIG. 8A is a diagram for describing a double sensing operation applied during a read process.

FIG. 8A shows how the double sensing operation in accordance with the present embodiment may be applied during a program process for a memory cell. For reference, FIG. 8A illustrates the case in which data stored in a memory cell is in the first program state PG1 of FIG. 1A.

In the case of a read process using a single sensing operation, the first voltage PV1 may be used as a sensing voltage to perform a first verify operation, and then the second voltage PV2 may be used as a sensing voltage to perform a second verify operation, in order to check whether the data stored in the memory cell is in the first program state PG1 and to read the data.

However, in the case of a read process using the double sensing operation in accordance with the present embodiment, the first and second voltages PV1 and PV2 may be simultaneously used as sensing voltages to perform one verify operation, in order to check whether data stored in the memory cell is in the first program state PG1 and to read the data.

In this way, the double sensing operation in accordance with the present embodiment may be reliably applied to a read process for a memory cell.

Figure 8B:
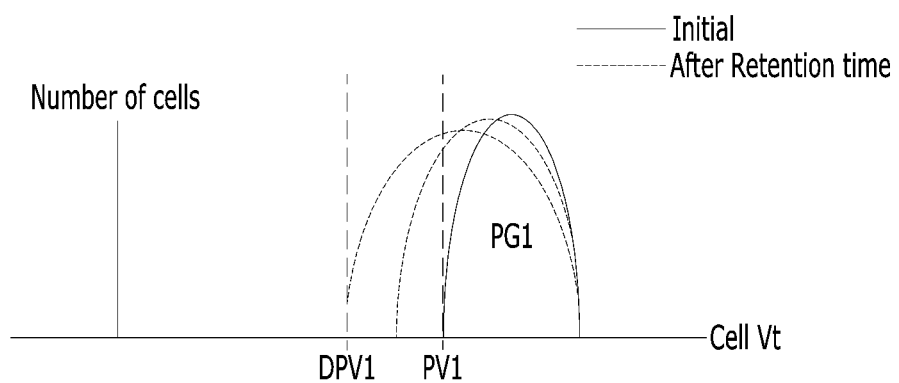
FIG. 8B is a diagram for describing a double sensing operation applied after a retention time.

FIG. 8B is a diagram for describing a double sensing operation applied after a retention time.

FIG. 8B shows how the double sensing operation in accordance with the present embodiment may be applied when the width of threshold voltage distribution of a memory cell is widened more than at the initial stage, as the retention time has passed after data was stored in the memory cell. For reference, FIG. 8B illustrates the case in which the retention time has elapsed after the memory cell was programmed in the first program state PG1 of FIG. 1A.

In order to check the state of data stored in a memory cell through the single sensing operation after the retention time, the first voltage PV1 may be used as a sensing voltage to perform a first verify operation. Then, the first sub voltage DPV1 lower than the first voltage PV1 may be used as a sensing voltage to perform a second verify operation, which makes it possible to check how much the width of the threshold voltage distribution of the data stored in the memory cell is widened due to the retention time.

However, when the state of the data stored in the memory cell is checked through the double sensing operation in accordance with the present embodiment after the retention time, the first voltage PV1 and the first sub voltage DPV1 lower than the first voltage PV1 may be simultaneously used as sensing voltages to perform one verify operation, which makes it possible to check how much the width of the threshold voltage distribution of the data stored in the memory cell is widened due to the retention time.

In this way, the double sensing operation in accordance with the present embodiment may be reliably applied even when the width of the threshold voltage distribution of the memory cell is widened more than at the initial stage, as the retention time has elapsed after data was stored in the memory cell.

Although various embodiments have been described for illustrative purposes, it will be apparent to those skilled in the art that various changes and modifications may be made without departing from the spirit and scope of the invention as defined in the following claims.

For example, the positions and types of the logic gates and the transistors, which are exemplified in the present embodiment, may be differently implemented depending on the polarities of signals inputted thereto.

What is claimed is:

1. A nonvolatile memory device comprising:
   a cell string comprising a plurality of memory cells coupled in series;
   a bit line coupled to the cell string; and
   a page buffer suitable for precharging the bit line, a first sensing node and a second sensing node to a preset level in a first period, and double-sensing the bit line through the first and second sensing nodes in a second period,
   wherein the page buffer comprises:
   a first coupling unit suitable for coupling the bit line and the first sensing node in response to a first control signal;
   a second coupling unit suitable for coupling the first and second sensing nodes in response to a second control signal, and controlling the first and second sensing nodes to have a voltage level interval according to a preset ratio in the second period;
   a first latch unit suitable for latching a logic level corresponding to a voltage level of the first sensing node in response to a third control signal; and
   a second latch unit suitable for latching a logic level corresponding to a voltage level of the second sensing node in response to a fourth control signal.

2. The nonvolatile memory device of claim 1, wherein the second coupling unit comprises:
   a switch suitable for selectively coupling the first and second sensing nodes in response to the second control signal; and
   a capacitor coupled in parallel to the switch between the first and second sensing nodes.

3. The nonvolatile memory device of claim 2, wherein the switch comprises an NMOS transistor suitable for selectively coupling the first and second sensing nodes, which are connected to drain and source thereof, in response to the second control signal applied to a gate thereof.

4. The nonvolatile memory device of claim 2,
   wherein the page buffer further comprises a third coupling unit suitable for selectively coupling a core voltage terminal and the first sensing node in response to a fifth control signal, and
   further comprising a control signal generator suitable for generating the first to fifth control signals.

5. The nonvolatile memory device of claim 4, wherein the control signal generator is further suitable for:
   activating the first, second and fifth control signals in the first period,
   deactivating the second and fifth control signals and activating the first control signal, in a third period included in the second period, and deactivating the first, second and fifth control signals and toggling the third and fourth control signals, in a fourth period included in the second period and subsequent to the third period.

6. The nonvolatile memory device of claim 5,
wherein the page buffer precharges the bit line and the first and second sensing nodes to a core voltage level by coupling the bit line, the first and second sensing nodes and the core voltage terminal through the first to third coupling units in the first period,
wherein the page buffer is further suitable for evaluating voltage levels of the bit line and the first sensing node by decoupling the first sensing node from the core voltage terminal through the third coupling unit and coupling the bit line and the first sensing node through the first coupling unit, in the third period,
wherein the page buffer controls the first and second sensing nodes to have the voltage level interval according to the preset ratio by coupling the first and second sensing nodes through the capacitor of the second coupling unit, in the third period, and
wherein the page buffer is further suitable for coupling the first sensing node and the bit line and decoupling the first sensing node from the core voltage terminal through the first and third coupling units and latching, respectively in the first and second latch units, logic levels corresponding to the voltage levels of the first and second sensing nodes in response to the toggling of the third and fourth control signals, in the fourth period.

7. The nonvolatile memory device of claim 5, wherein the control signal generator is further suitable for activating the first and second control signals and deactivating the fifth control signal in a fifth period included in the second period and prior to the third period.

8. The nonvolatile memory device of claim 7, wherein the page buffer is further suitable for evaluating the voltage levels of the bit line and the first and second sensing nodes by decoupling the first sensing node from the core voltage terminal through the third coupling unit and coupling the bit line and the first and second sensing nodes through the first and second coupling units, in the fifth period.

9. The nonvolatile memory device of claim 8, wherein the control signal generator is further suitable for adjusting a length of the fifth period by adjusting a length of a period in which the second control signal is activated while the first control signal is activated and the fifth control signal is deactivated.

10. The nonvolatile memory device of claim 9, wherein the page buffer uses a ratio of respective lengths of the third and fifth periods as the preset ratio.

11. The nonvolatile memory device of claim 10,
wherein the page buffer controls the first and second sensing nodes to have a greater voltage level interval by decreasing the length of the fifth period and increasing the length of the third period, and
wherein the page buffer controls the first and second sensing nodes to have a less voltage level interval by increasing the length of the fifth period and decreasing the length of the third period.

12. A nonvolatile memory device comprising:
a bit line coupled to a cell string;
a page buffer including:
a coupling circuit including a switching element and a capacitive element, which are coupled in parallel between first and second nodes, and
first and second latch circuits coupled to the respective first and second nodes; and
a control circuit configured to:
precharge the bit line and the first and second nodes by providing a precharge voltage to the first node coupled to the bit line and turning on the switching element, and
electrically isolate, after the precharge, the first node from the bit line while controlling the first and second latch circuits to latch logic levels of the respective first and second nodes,
wherein the control circuit is further configured to turn off the switching element after the precharge and before electrical isolation of the first node from the bit line, and
wherein the logic levels which were latched are utilized for a double sensing operation on a memory cell of the cell string.

* * * * *